(12) United States Patent
Park et al.

(10) Patent No.: US 9,680,119 B2
(45) Date of Patent: Jun. 13, 2017

(54) WHITE ORGANIC LIGHT EMITTING DISPLAY DEVICE AND ORGANIC LIGHT EMITTING DISPLAY APPARATUS USING THE SAME

(71) Applicant: LG Display Co., Ltd., Seoul (KR)

(72) Inventors: Jung Soo Park, Seoul (KR); Hong Seok Choi, Seoul (KR); Seung Ryong Joung, Gimpo-si (KR); SoYeon Ahn, Seoul (KR); Min Gyu Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/848,168

(22) Filed: Sep. 8, 2015

(65) Prior Publication Data

US 2016/0118612 A1 Apr. 28, 2016

(30) Foreign Application Priority Data

Oct. 28, 2014 (KR) .................. 10-2014-0147733
Dec. 5, 2014 (KR) .................. 10-2014-0173477

(51) Int. Cl.
| | |
|---|---|
| *H01L 27/15* | (2006.01) |
| *H01L 31/12* | (2006.01) |
| *H01L 33/00* | (2010.01) |
| *H01L 51/50* | (2006.01) |

(Continued)

(52) U.S. Cl.
CPC .......... *H01L 51/504* (2013.01); *H01L 27/322* (2013.01); *H01L 27/3213* (2013.01); *H01L 51/5004* (2013.01); *H01L 51/5024* (2013.01); *H01L 51/5044* (2013.01); *H01L 51/5056* (2013.01); *H01L 51/5212* (2013.01); *H01L 51/5221* (2013.01); *H01L 51/5253* (2013.01);

(Continued)

(58) Field of Classification Search
CPC . H01L 27/32; H01L 27/3202; H01L 27/3204; H01L 27/3209; H01L 27/3225; H01L 2227/32; H01L 2924/12044
See application file for complete search history.

(56) References Cited

U.S. PATENT DOCUMENTS

| | | |
|---|---|---|
| 2006/0040132 A1 | 2/2006 | Liao et al. |
| 2008/0268282 A1 | 10/2008 | Spindler et al. |
| 2011/0073844 A1 | 3/2011 | Pieh et al. |

(Continued)

FOREIGN PATENT DOCUMENTS

| | | |
|---|---|---|
| CN | 101006594 | 7/2007 |
| CN | 101179115 | 5/2008 |

(Continued)

OTHER PUBLICATIONS

Office Action for Chinese Patent Application No. CN 201510646510.0, Feb. 3, 2017, 21 Pages.

*Primary Examiner* — Hoai V Pham
(74) *Attorney, Agent, or Firm* — Fenwick & West LLP

(57) ABSTRACT

Disclosed is a white organic light emitting display device comprising first and second electrodes, and a first emitting part between the first and second electrodes, the first emitting part including a red emitting layer and a blue emitting layer adjacent to the red emitting layer, wherein the red emitting layer includes a first host material which does not absorb a blue light emitted from the blue emitting layer, and an organic light emitting display apparatus using the same.

27 Claims, 7 Drawing Sheets

(51) Int. Cl.
*H01L 51/52* (2006.01)
*H01L 27/32* (2006.01)
(52) U.S. Cl.
CPC .. *H01L 51/5278* (2013.01); *H01L 2251/5384* (2013.01); *H01L 2251/55* (2013.01)

(56) References Cited

U.S. PATENT DOCUMENTS

2015/0280158 A1* 10/2015 Ogiwara ............. H01L 51/5044
257/40
2016/0079556 A1 3/2016 Yoo et al.

FOREIGN PATENT DOCUMENTS

| CN | 102034934 | 4/2011 |
| CN | 103187537 | 7/2013 |
| CN | 103872253 | 6/2014 |

* cited by examiner

WHITE ORGANIC LIGHT EMITTING DISPLAY DEVICE AND ORGANIC LIGHT EMITTING DISPLAY APPARATUS USING THE SAME

CROSS REFERENCE TO RELATED APPLICATIONS

This application claims the benefit of the Korean Patent Application No. 10-2014-0147733 filed on Oct. 28, 2014 and the Korean Patent Application No. 10-2014-0173477 filed on Dec. 5, 2014, which are hereby incorporated by reference as if fully set forth herein.

BACKGROUND

Field of the Disclosure

Embodiments of the present invention relate to an organic light emitting display device, and more particularly, to a white organic light emitting display device for emitting a white light and an organic light emitting display apparatus using the same.

Discussion of the Related Art

An organic light emitting display device is provided in such a structure in which a light emitting layer is formed between a cathode for injecting an electron and an anode for injecting a hole. When the electron generated in the cathode and the hole generated in the anode are injected into the inside of the light emitting layer, an exciton is produced by recombination of the electron and hole. Then, when the exciton falls to a ground state from an excited state, the organic light emitting display device emits light.

The organic light emitting display device may be applied as a thin-profile light source of a liquid crystal display device or display device as well as lighting. Especially, the organic light emitting diode for emitting a white light may be combined with a color filter, and may be applied to a full-color display device.

A white organic light emitting display device for emitting a white light may be formed in a structure including two light emitting layers with complementary colors. In this structure, when the white light transmits through the color filter, there is a difference between a peak wavelength region for each light emitting layer and a transmission region of the color filter, whereby a color reproduction range becomes small, that is, it is difficult to realize a desired color reproduction ratio.

For example, in case of an organic light emitting display device including blue and yellow emitting layers for an emission of white light, an emission peak wavelength is formed in a blue wavelength region and a yellow wavelength region, to thereby emit a white light. However, if the white light transmits through red, green and blue color filters, a transmittance of the blue wavelength region is relatively lower than a transmittance of a red or green wavelength region, thereby causing a low emission efficiency and a low reproduction ratio. Also, the blue emitting layer is formed of a fluorescent material and the yellow emitting layer is formed of a phosphorescent material. In this case, an emission efficiency of the yellow emitting layer of the phosphorescent material is relatively higher than an emission efficiency of the blue emitting layer of the fluorescent material, whereby an emission efficiency and a color reproduction ratio are lowered due to a difference between the efficiency of the yellow emitting layer of the phosphorescent material and the efficiency of the blue emitting layer of the fluorescent material.

The organic light emitting display device of the related art is disclosed in the Korean Patent Application Publication No. 10-2011-0035048.

SUMMARY

Accordingly, embodiments of the present invention are directed to a white organic light emitting display device that substantially obviates one or more problems due to limitations and disadvantages of the related art.

An aspect of embodiments of the present invention is directed to provide a white organic light emitting display device with a new structure capable of improving luminance and color reproduction ratio through various experiments for improving emission efficiency of emitting layer and color reproduction ratio of device.

Another aspect of embodiments of the present invention is directed to provide a white organic light emitting display device which improves emission intensity and emission efficiency by adjusting the properties of an emitting layer.

Another aspect of embodiments of the present invention is directed to provide a white organic light emitting display device which improves luminance and color reproduction ratio by applying a TER-TEP (Three Emission Region-Three Emission Peak) structure having three emitting parts and three emission peaks.

Another aspect of embodiments of the present invention is directed to provide a white organic light emitting display device which improves emission efficiency and color reproduction ratio, and an organic light emitting display device using the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a white organic light emitting display device that may include first and second electrodes; and a first emitting part between the first and second electrodes, the first emitting part including a red emitting layer and a blue emitting layer adjacent to the red emitting layer, wherein the red emitting layer includes a first host material which does not absorb a blue light emitted from the blue emitting layer.

An energy band gap of the first host material may not be less than 2.7 eV.

The first host material may include an organic material having a hole transporting property.

Also, an energy band gap of the organic material having the hole transporting property may be within a range of 2.8 eV to 3.5 eV.

The first host material may include a host material of the blue emitting layer.

Also, an energy band gap of the host material of the blue emitting layer may not be more than a value of 0.3 eV more than the energy band gap of the first host material.

The red emitting layer may further include a second host material, and an energy band gap of the second host material is different from that of the first host material.

Also, an energy band gap of the second host material may be within a range of 2.2 eV to 2.4 eV.

A weight ratio of the first host material to the second host material may be 7~8:2~3.

The first electrode may be an anode, the second electrode may be a cathode, and the blue emitting layer may be closer to the second electrode than the red emitting layer.

Furthermore, the white organic light emitting display device may include an emission adjusting part between the red emitting layer and the blue emitting layer, the emission adjusting part including an organic material having a hole transporting property.

The white organic light emitting display device may further include a second emitting part having a first peak wavelength between the first electrode and the first emitting part and a third emitting part having a second peak wavelength on the second emitting part, wherein the first emitting part, the second emitting part and the third emitting part include a TER-TEP (Three Emission Region-Three Emission Peak) structure.

The first peak wavelength may be within a range of 440 nm to 480 nm, the second peak wavelength may be within a range of 520 nm to 590 nm, and peak wavelengths of the red emitting layer and the blue emitting layer may be within a range of 600 nm to 650 nm and 440 nm to 480 nm.

The second emitting part having the first peak wavelength may be closest to the first electrode, and the first emitting part including the red emitting layer and the blue emitting layer may be closest to the second electrode.

In another aspect of embodiments of the present invention, there is provided a white organic light emitting display device that may include first and second electrodes; and at least two emitting parts between the first and second electrodes, the at least two emitting parts emitting light with different wavelengths, wherein at least one among the at least two emitting parts includes a first emitting layer and a second emitting layer, the first emitting layer and the second emitting layer being adjacent to each other and emitting light with different wavelengths, and an energy band gap of a host material of the second emitting layer is adjusted based on an energy band gap of a host material of the first emitting layer so as to reduce an absorption amount of the light, which is emitted from the first emitting layer, in the second emitting layer.

The energy band gap of the host material of the second emitting layer may be adjusted so that the energy band gap of the host material of the first emitting layer is no more than a value of 0.3 eV more than the energy band gap of the host material of the second emitting layer.

The host material of the first emitting layer may include a fluorescent host material, and the host material of the second emitting layer may include an organic material having a hole transporting property.

In another aspect of embodiments of the present invention, there is provided an organic light emitting display apparatus that may include a substrate; a white organic light emitting display device for emitting a white light, the white organic light emitting display device on the substrate; an encapsulation layer on the white organic light emitting display device; and a color filter layer for transmitting light with a predetermined wavelength in the white light emitted from the white organic light emitting display device, wherein the white organic light emitting display device includes first and second electrodes; and an emitting part between the first and second electrodes, the emitting part including a red emitting layer and a blue emitting layer adjacent to the red emitting layer, wherein the red emitting layer includes a first host material which does not absorb a blue light emitted from the blue emitting layer.

A white organic light emitting display device according to the embodiment of the present invention may include a first emitting part between first and second electrodes, a second emitting part on the first emitting part, and a third emitting part on the second emitting part, wherein the third emitting part includes a red emitting layer and a blue emitting layer, and a host of the red emitting layer includes a hole transporting layer, to thereby improve emission efficiency and emission intensity.

The blue emitting layer of the third emitting part may be any one among a blue emitting layer, a deep-blue emitting layer and a sky-blue emitting layer.

An energy band gap of the hole transporting layer may be within a range of 2.8 eV to 3.5 eV.

An emission peak of the third emitting part may include a first emission peak and a second emission peak.

The first emission peak may be within a range of 600 nm to 650 nm.

The second emission peak may be within a range of 440 nm to 480 nm.

A white organic light emitting display device according to the embodiment of the present invention may include a first emitting part between first and second electrodes, a second emitting part on the first emitting part, and a third emitting part on the second emitting part, wherein the first emitting part, the second emitting part and the third emitting part include a TER-TEP (Three Emission Region-Three Emission Peak) structure having three emission peaks, to thereby improve luminance and color reproduction ratio.

The first emitting part may include an emitting layer of any one among a blue emitting layer, a deep-blue emitting layer and a sky-blue emitting layer.

The second emitting part may include any one among yellow-green emitting layer or green emitting layer.

The third emitting part may include a first emitting layer of a red emitting layer, and a second emitting layer of any one among a blue emitting layer, a deep-blue emitting layer and a sky-blue emitting layer.

A host of the first emitting layer may include a hole transporting layer.

An energy band gap of the hole transporting layer may be within a range of 2.8 eV to 3.5 eV.

The second emitting layer is closer to the second electrode than the first emitting layer.

An emission peak of the first emitting part may be within a range of 440 nm 480 nm, an emission peak of the second emitting part may be within a range of 520 nm to 590 nm, and an emission peak of the third emitting part may be within a range of 600 nm to 650 nm and 440 nm to 480 nm.

A white organic light emitting display device according to the embodiment of the present invention may include first and second electrodes confronting each other on a substrate, and at least two emitting parts between the first and second electrodes, wherein at least one among at least two emitting parts includes two emitting layers, and any one among the two emitting layers includes a host of a hole transporting layer, to thereby improve emission intensity and emission efficiency.

A white organic light emitting display device according to the embodiment of the present invention may include first and second electrodes confronting each other on a substrate, and at least two emitting parts between the first and second electrodes, wherein at least one among at least two emitting parts includes at least two emitting layers having a red emitting layer, and any one among at least two emitting layers includes a host of a hole transporting layer, to thereby improve emission intensity and emission efficiency.

The two emitting layers may be a red emitting layer and a blue emitting layer.

The hole transporting layer may be a host for the red emitting layer.

The blue emitting layer is closer to the second electrode than the red emitting layer.

A white organic light emitting display device according to the embodiment of the present invention may include a first emitting part between first and second electrodes, a second emitting part on the first emitting part, and a third emitting part on the second emitting part, wherein at least one among the first emitting part, the second emitting part and the third emitting part includes two emitting layers of a red emitting layer and a blue emitting layer, and at least two host materials in the red emitting layer have different energy band gaps so as to improve emission intensity and emission efficiency.

The energy band gap of the host material of the blue emitting layer may be no more than a value of 0.3 eV more than the energy band gap of any one host material included the red emitting layer.

The any one host material in the red emitting layer may include an organic material having a hole transporting property.

The red emitting layer and blue emitting layer may be adjacent to each other.

The first electrode may be an anode, the second electrode may be a cathode, and the blue emitting layer may be more adjacent to the second electrode in comparison to the red emitting layer.

The red emitting layer may include a first host material which does not absorb a blue light emitted from the blue emitting layer, and a second host material different from the first host material.

An energy band gap of the first host material may be within a range of 2.8 eV to 3.5 eV.

The first host material may include an organic material having a hole transporting property.

The first host material may include a host material of the blue emitting layer.

Also, the second host material may include a red phosphorescent host material, and an energy band gap of the second host material may be within a range of 2.2 eV to 2.4 eV.

A weight ratio of the first host material to the second host material may be 7~8:2~3.

The third emitting part may include a first emitting layer of a red emitting layer, and a second emitting layer of any one among a blue emitting layer, a deep-blue emitting layer and a sky-blue emitting layer.

The case of the blue emitting layer being more adjacent to the second electrode than the red emitting layer reduces a color shift rate as compared to the case of the red emitting layer being more adjacent to the second electrode than the blue emitting layer.

An emission peak of the first emitting part may be within a range of 440 nm 480 nm, an emission peak of the second emitting part may be within a range of 510 nm to 590 nm, and an emission peak of the third emitting part may be within a range of 600 nm to 650 nm and 440 nm to 480 nm.

An emission adjusting part is between the red emitting layer and the blue emitting layer, wherein the emission adjusting part includes an organic material having a hole transporting property.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1:
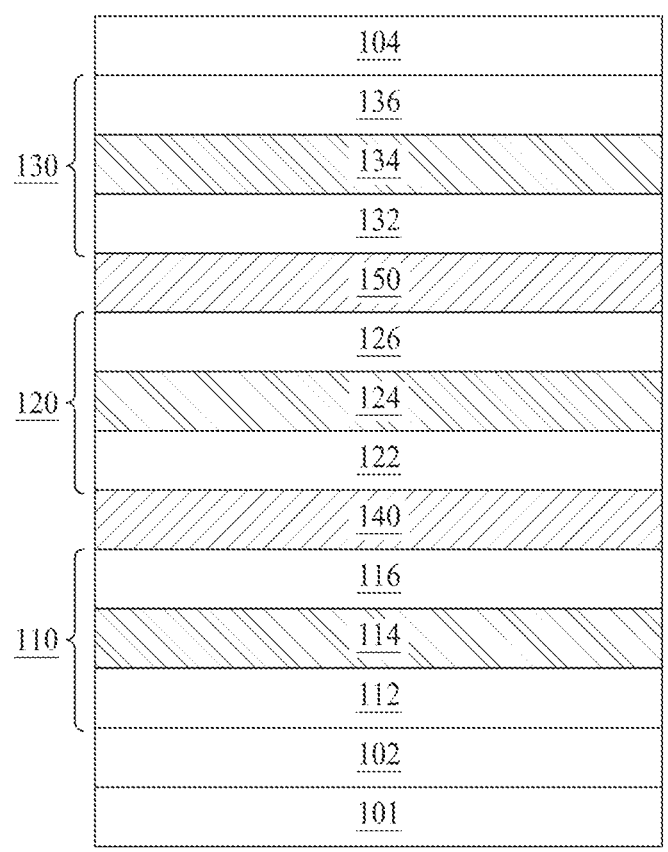
FIG. 1 is a cross sectional view illustrating a white organic light emitting display device according to one embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a white organic light emitting display device according to embodiments of the present invention and an organic light emitting display device using the same will be described in detail with reference to the accompanying drawings.

FIG. 1 is a cross sectional view illustrating a white organic light emitting display device according to the first embodiment of the present invention.

As shown in FIG. 1, the white organic light emitting display device according to the first embodiment of the present invention may include first and second electrodes 102 and 104 on a substrate 101, and first, second and third emitting parts 110, 120 and 130 between the first and second electrodes 102 and 104.

The first electrode 102 is an anode for supplying a hole, and the first electrode 102 is formed of a transparent conductive material such as TCO (Transparent Conductive Oxide), for example, ITO (Indium Tin Oxide) or IZO (Indium Zinc Oxide), but is not limited to these materials.

The second electrode 104 is a cathode for supplying an electron, and the second electrode 104 is formed of a metal material, for example, gold (Au), silver (Ag), aluminum (Al), molybdenum (Mo), magnesium (Mg), and etc., or their alloys, but is not limited to these materials.

The first electrode 102 and the second electrode 104 may be respectively referred to as the anode and the cathode. Also, the first electrode 102 may be referred to as a transflective electrode, and the second electrode 104 may be referred to as a reflective electrode.

Herein, a bottom emission mode with the first electrode 102 of the transflective electrode and the second electrode 104 of the reflective electrode will be described in detail.

The first emitting part 110 may include a first hole transporting layer (HTL) 112, a first emitting layer (EML) 114, and a first electron transporting layer (ETL) 116 above the first electrode 102.

The first emitting layer (EML) 114 includes a blue emitting layer.

In addition, a first charge generating layer (CGL) 140 may be provided between the first emitting part 110 and the second emitting part 120. The first charge generating layer (CGL) 140 controls a charge balance between the first emitting part 110 and the second emitting part 120. The first charge generating layer (CGL) 140 may include an N-type charge generating layer (N-CGL) and a P-type charge generating layer (P-CGL).

The second emitting part 120 may include a second hole transporting layer (HTL) 122, a first emitting layer (EML) 124, and a second electron transporting layer (ETL) 126.

The first emitting layer (EML) 124 of the second emitting part 120 includes a yellow-green emitting layer.

The third emitting part 130 may include a third electron transporting layer (ETL) 136, a first emitting layer (EML) 134, and a third hole transporting layer (HTL) 132 provided below the second electrode 104.

The first emitting layer (EML) 134 of the third emitting part 130 may include a blue emitting layer.

In addition, a second charge generating layer (CGL) 150 may be provided between the second emitting part 120 and the third emitting part 130. The second charge generating layer (CGL) 150 controls a charge balance between the second emitting part 120 and the third emitting part 130. The second charge generating layer (CGL) 150 may include an N-type charge generating layer (N-CGL) and a P-type charge generating layer (P-CGL).

Figure 2:
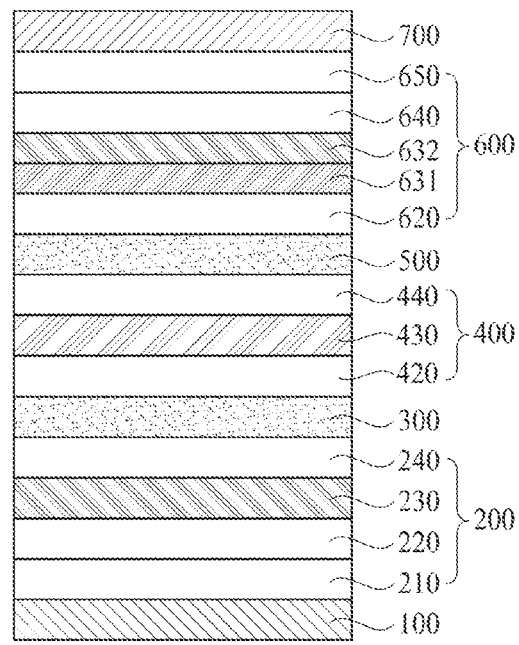
FIG. 2 is a cross sectional view illustrating an organic light emitting display device according to another embodiment of the present invention.

FIG. 2 is a cross sectional view illustrating an organic light emitting display device according to another embodiment of the present invention.

As shown in FIG. 2, the organic light emitting display device according to another embodiment of the present invention may include a first electrode 100, a first emitting part 200, a first charge generating layer 300, a second emitting part 400, a second charge generating layer 500, a third emitting part 600, and a second electrode 700.

The first electrode 100 may function as an anode for injecting a hole. The first electrode 100 may be formed of a transparent conductive oxide material with high conductivity and high work function, for example, ITO (Indium Tin Oxide), IZO (Indium Zinc Oxide), $SnO_2$ or ZnO, but is not limited to these materials.

The first emitting part 200 is provided on the first electrode 100, and the first emitting part 200 emits a blue light. The first emitting part 200 may include a hole injecting layer 210, a first hole transporting layer 220, a first emitting layer 230, and a first electron transporting layer 240.

The hole injecting layer 210 is provided on the first electrode 100. The hole injecting layer 210 may be formed of MTDATA(4,4',4"-tris(3-methylphenylphenylamino)triphenylamine), CuPc(copper phthalocyanine) or PEDOT/PSS(poly(3,4-ethylenedioxythiphene, polystyrene sulfonate), but is not limited to these materials. For example, the hole injecting layer 210 may be formed by doping a material for the first hole transporting layer 220 with P-type dopant.

The first hole transporting layer 220 is provided on the hole injecting layer 210. The first hole transporting layer 220 may be formed of TPD(N,N'-bis(3-methylphenyl)-N,N'-bis (phenyl)-benzidine), NPD(N,N'-bis(naphthalene-1-yl)-N, N'-bis(phenyl)-2,2'-dimethylbenzidine), s-TAD(2,2',7,7'-tetrakis(N,N-diphenylamino)-9,9-spirofluorene), MTDATA(4, 4',4"-Tris(N-3-methylphenyl-N-phenyl-amino)-triphenylamine), or NPB(N,N'-bis(naphthalene-1-yl)-N,N'-bis(phenyl)-benzidine), but is not limited to these materials. Except that the P-type dopant is not included, the material for the first hole transporting layer 220 may be the same as the material for the hole injecting layer 210. In this case, the hole injecting layer 210 and the first hole transporting layer 220 may be formed by a sequential stacking process in the same processing apparatus. The first hole transporting layer 220 may be formed in a structure including two or more layers using two or more different kinds of materials.

The first emitting layer 230 is provided on the first hole transporting layer 220. The first emitting layer 230 includes a blue emitting layer for emitting a blue light. The blue emitting layer of the first emitting layer 230 may emit a deep blue or sky blue light in addition to the blue light.

The first emitting layer 230 may include an organic material for emitting a blue light whose peak wavelength range is within a range from 440 nm to 480 nm. In more detail, the first emitting layer 230 may be formed by doping fluorescent blue dopant into a fluorescent host material of at least one material selected from a group including anthracene derivative, pyrene derivative and perylene derivative, but not necessarily.

The first electron transporting layer 240 is provided on the first emitting layer 230. The first electron transporting layer 240 may be formed of $Alq_3$(tris(8-hydroxy-quinolinato) aluminum), PBD(2-(4-biphenyl)5-(4-tert-butylphenyl)-1,3, 4-oxadiazole), TAZ(3-(4-biphenyl)-4-phenyl-5-tert-butylphenyl-1,2,4-triazole), spiro-PBD, BAlq(bis(2-methyl-8-quinolinolate)-4-(phenylphenolato)aluminium), Liq(8-hydroxyquinolinolato-lithium), BMB-3T, PF-6P, TPBI(2,2', 2"-(1,3,5-benzinetriyl)-tris(1-phenyl-1-H-benzimidazole), COT, SAlq, oxadiazole, triazole, phenanthroline, benzoxazole or benzthiazole, but is not limited to these materials. The first electron transporting layer 240 may be formed in a structure including two or more layers using two or more different kinds of materials.

The first charge generating layer (CGL) 300 is provided between the first emitting part 200 and the second emitting part 400, wherein the first charge generating layer (CGL) 300 controls a charge balance between the first emitting part 200 and the second emitting part 400. The first charge generating layer (CGL) 300 may include an N-type charge generating layer provided on the first emitting part 200 and positioned adjacent to the first emitting part 200, and a P-type charge generating layer provided on the N-type charge generating layer and positioned adjacent to the second emitting part 400. The N-type charge generating layer injects an electron into the first emitting part 200, and the P-type charge generating layer injects a hole into the second emitting part 400. The N-type charge generating layer may be formed of an organic layer doped with alkali metal such as Li, Na, K or Cs, or doped with alkali earth metal such as Mg, Sr, Ba or Ra, but is not limited to these materials. The P-type charge generating layer may be formed of an organic layer including P-type dopant, or may be formed by doping an organic material having a hole transporting property with dopant, but not necessarily. The first charge generating layer 300 may be formed in a single-layered structure.

The second emitting part 400 is provided on the first charge generating layer 300. The second emitting part 400 emits a yellow-green light or a green light. The second emitting part 400 may include a second hole transporting layer 420, a second emitting layer 430, and a second electron transporting layer 440.

The second hole transporting layer 420 is provided on the first charge generating layer 300. The second hole transporting layer 420 may be formed of TPD(N,N'-bis(3-methylphenyl)-N,N'-bis(phenyl)-benzidine), NPD (N,N'-bis(naphthalene-1-yl)-N,N'-bis(phenyl)-2,2'-dimethylbenzidine), or NPB(N,N'-bis(naphthalene-1-yl)-N,N'-bis(phenyl)-benzidine), but is not limited to these materials. The second hole transporting layer 420 and the first hole transporting layer 220 may be formed of the same material, or may be formed of different materials if needed.

The second emitting layer 430 is provided on the second hole transporting layer 420.

The second emitting layer 430 may include an organic material for emitting a yellow-green light, for example, a light whose peak wavelength range is within a range from 520 nm to 590 nm. In more detail, the second emitting layer 430 may be formed by doping phosphorescent yellow-green dopant into a phosphorescent host material of carbazole compound or metal complex. The carbozole compound may include CBP(4,4'-bis)carbazol-9-yl)biphenyl), CBP derivative, mCP(1,3-bis(carbazol-9-yl)benzene) or mCP derivative, and the metal complex may include ZnPBO(phenyloxazole) metal complex or ZnPBT(phenylthiazole) metal complex.

The second emitting layer 430 may include an organic material for emitting a green light, for example, a light whose peak wavelength range is within a range from 540 nm to 590 nm. In more detail, the second emitting layer 430 may be formed by doping green dopant into a phosphorescent host material of carbazole compound or metal complex.

The second electron transporting layer 440 is provided on the second emitting layer 430. The second electron transporting layer 440 may be formed of oxadiazole, triazole, phenanthroline, benzoxazole or benzthiazole, but is not limited to these materials. The material for the second electron transporting layer 440 may be the same as the material for the first electron transporting layer 240, or may be different from the material for the first electron transporting layer 240, if needed.

The second charge generating layer 500 is provided between the second emitting part 400 and the third emitting part 600, wherein the second charge generating layer 500 controls a charge balance between the second emitting part 400 and the third emitting part 600. The second charge generating layer 500 may include an N-type charge generating layer formed on the second emitting part 400 and positioned adjacent to the second emitting part 400, and a P-type charge generating layer formed on the N-type charge generating layer and positioned adjacent to the third emitting part 600. The materials for the N-type charge generating layer and the P-type charge generating layer may be the same as those of the aforementioned first charge generating layer 300.

The third emitting part 600 is provided on the second charge generating layer 500, wherein the third emitting part 600 emits a mixed light of blue light and red light. The third emitting part 600 may include a third hole transporting layer 620, a third emitting layer 631, a fourth emitting layer 632, a third electron transporting layer 640, and an electron injecting layer 650.

The third hole transporting layer 620 is provided on the second charge generating layer 500. The third hole transporting layer 620 may be formed of TPD (N,N'-bis(3-methylphenyl)-N,N'-bis(phenyl)-benzidine), NPD (N,N'-bis(naphthalene-1-yl)-N,N'-bis(phenyl)-2,2'-dimethylbenzidine), or NPB (N,N'-bis(naphthalene-1-yl)-N,N'-bis(phenyl)-benzidine), but is not limited to these materials. The material for the third hole transporting layer 620 may be the same as the material for the first hole transporting layer 220 or the second hole transporting layer 420, or may be different from the material for the first hole transporting layer 220 or the second hole transporting layer 420, if needed.

The third emitting layer 631 is provided on the third hole transporting layer 620. The third emitting layer 631 may include a red emitting layer for emitting a red light.

The third emitting layer 631 may include an organic material for emitting the red light, for example, the light whose peak wavelength range is within a range of 600 nm to 650 nm. The third emitting layer 631 may be formed by doping red dopant of metal complex of iridium (Ir) or platinum (Pt) into a host material. The host material of the third emitting layer 631 may include a first host material and a second host material.

The first host material includes an organic material having an energy band gap which does not absorb the blue light. Particularly, the first host material includes an organic material whose energy band gap is no less than 2.7 eV. The first host material whose energy band gap is no less than 2.7 eV may include an organic material having a hole transporting property. For example, the first host material may include the same material as that of the first hole transporting layer 220, the second hole transporting layer 420 or the third hole transporting layer 620.

The second host material includes an organic material whose energy band gap is less than 2.7 eV. Especially, the second host material may include a red phosphorescent host material whose energy band gap is within a range of 2.2 eV to 2.4 eV. In more detail, the second host material may include a phosphorescent host material such as carbazole compound or metal complex, but is not limited to these materials.

The fourth emitting layer 632 is provided on the third emitting layer 631. The fourth emitting layer 632 includes a blue emitting layer for emitting a blue light. The blue emitting layer for the fourth emitting layer 632 may emit a deep blue or sky blue light in addition to the blue light.

The fourth emitting layer 632 may include an organic material for emitting the blue light whose peak wavelength range is within a range of 440 nm to 480 nm. In more detail, the fourth emitting layer 632 may be formed by doping fluorescent blue dopant into a fluorescent host material of at least one material selected from a group including anthracene derivative, pyrene derivative and perylene derivative, but not necessarily.

The third electron transporting layer 640 is provided on the fourth emitting layer 632. The third electron transporting layer 640 may be formed of oxadiazole, triazole, phenanthroline, benzoxazole or benzthiazole, but is not limited to these materials. The material for the third electron transporting layer 640 may be the same as that of the first electron transporting layer 240 or the second electron transporting layer 440, or may be different from that of the first electron transporting layer 240 or the second electron transporting layer 440, if needed.

The electron injecting layer 650 is provided on the third electron transporting layer 640. The electron injecting layer 650 may be formed of LiF (Lithium Fluoride) or LiQ (Lithium Quinolate), but is not limited to these materials.

The second electrode 700 is provided on the third emitting part 600. The second electrode 700 functions as a cathode for supplying an electron. The second electrode 700 may be formed of a metal material with low work function, for example, aluminum (Al), gold (Au), silver (Ag), molybdenum (Mo), magnesium (Mg), lithium (Li), calcium (Ca), and etc., or their alloys, but not limited to these materials.

The second electrode 700 may function as a reflective electrode, and the first electrode 100 may function as a transflective electrode. In this case, it is possible to improve a light efficiency through a microcavity between the first electrode 100 and the second electrode 700. Owing to the microcavity, a constructive interference occurs by repetitive reflection and re-reflection of the light between the first electrode 100 and the second electrode 700 spaced apart from each other by a length of light path, so that it is possible to improve the light efficiency by an amplification of finally-emitted light.

In the structure of FIG. 1, the yellow-green emitting layer of the first emitting layer (EML) 124 of the second emitting part 120 should emit both red and green ranges, whereby the emission efficiency of red light and green light is lowered. Especially, an emission intensity of the red light corresponding to a longer wavelength range is lowered so that the emission efficiency of the red light is lowered.

A wavelength in which a transmittance of the color filter is at the maximum does not correspond to an emission peak of the yellow-green emitting layer, whereby the emission efficiency of the red light and green light is lowered.

In the white organic light emitting display device for realizing the red, green and blue light through the use of color filters, the red and green ranges should be realized by the yellow-green emitting layer, thereby causing a low color purity of the red color and green color.

In order to improve the red emission efficiency, an emitting part including a red emitting layer may be additionally provided in one emitting part of the structure shown in FIG. 1. In this case, a driving voltage may be raised due to an increased thickness of the device.

Accordingly, inventors of the present invention have performed various experiments so as to improve the efficiency in the blue emitting layer and the red emitting layer without an additional emitting part. In particular, the inventors have performed various experiments for one emitting part having the blue emitting layer and the red emitting layer among the three emitting parts.

Figure 3:
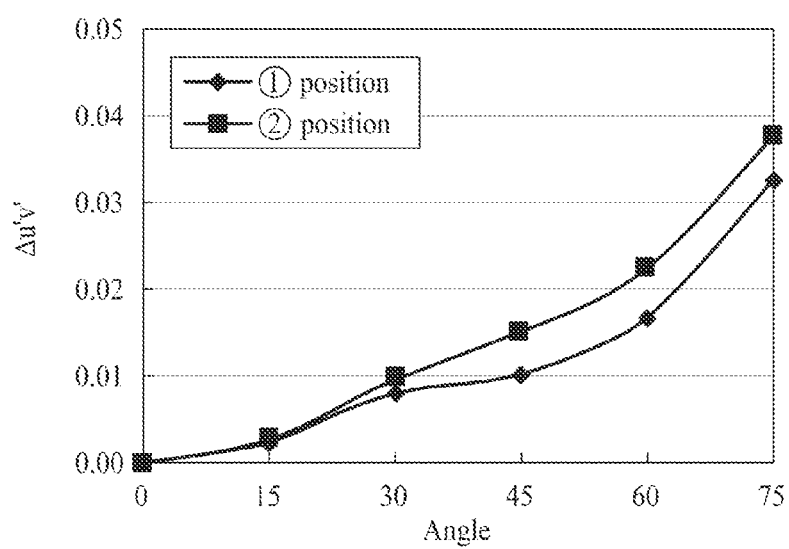
FIG. 3 is a graph illustrating a color shift rate in accordance with a viewing angle when a stacking order of third and fourth emitting layers in a third emitting part is changed in the organic light emitting display device according to the present invention.

When both the blue emitting layer and the red emitting layer are included in one emitting part, Δu'v' is checked in accordance with a viewing angle according to a position of the red emitting layer, which is shown in FIG. 3. Δu'v' refers to a color shift rate according to change in viewing angle. Δu'v' at a specific viewing angle denotes a difference between the color coordinate at the viewing angle 0° and the color coordinate at the specific viewing angle. Δu'v' is measured by CIE 1976 UCS diagram (u' v' coordinate system).

FIG. 3 illustrates a color shift rate in accordance with a viewing angle according to a position of the emitting part according to the second embodiment of the present invention.

In FIG. 3, a horizontal axis denotes a viewing angle, and a vertical axis denotes Δu'v'.

FIG. 3 illustrates the color shift rate in accordance with the viewing angle when the red emitting layer is positioned ① under the blue emitting layer, and ② above the blue emitting layer.

As shown in FIG. 3, while the position ① shows the relatively small color shift rate in accordance with the viewing angle, the position ② shows the relatively large color shift rate in accordance with the viewing angle. From this, it is noted that the position ① has the change of white color smaller than the position ②. For example, in case of the viewing angle 60°, Δu'v' is 0.0167 at the position ①, and Δu'v' is 0.0224 at the position ②. Thus, Δu'v' at the position ① is smaller than Δu'v' at the position ②.

According to the results for the color shift rate in accordance with the viewing angle, Δu'v' in accordance with the viewing angle is small when the red emitting layer is under the blue emitting layer in the third emitting part 600. Also, the small color shift rate enables to prevent a color shift and to reduce bad influence on picture quality. Therefore, as shown in FIG. 2, the red emitting layer 631 is under the blue emitting layer 632 in the third emitting part 600 to improve the color shift rate according to the viewing angle.

Also, the inventors of the present invention find out that only the red emitting layer is luminescent when the two emitting layers of the red emitting layer and the blue emitting layer are included in the third emitting part 600. This will be described with reference to FIG. 4.

Figure 4:
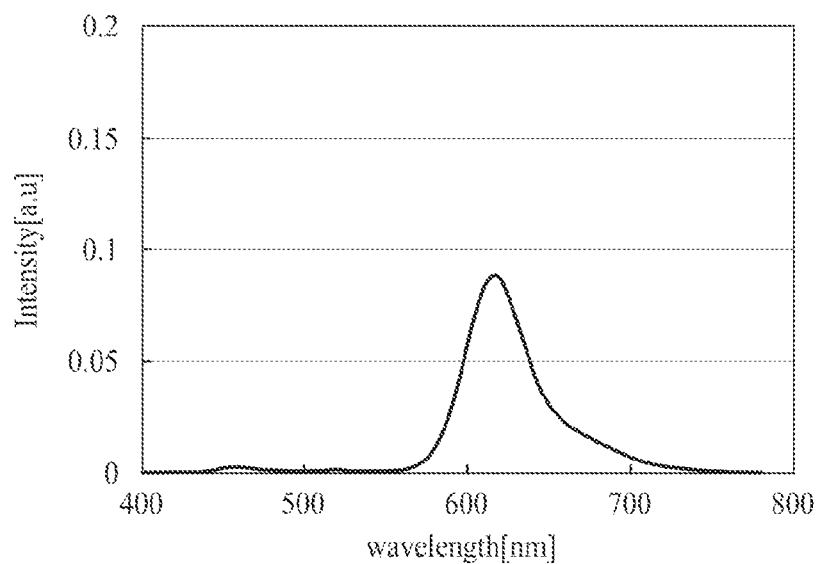
FIG. 4 illustrates an emission intensity of an emitting part having red and blue emitting layers in the organic light emitting display device according to the present invention.

FIG. 4 illustrates an emission intensity of the emitting part according to the second embodiment of the present invention. In FIG. 4, a horizontal axis represents a wavelength (nm) of light, and a vertical axis represents emission intensity (a.u., arbitrary unit).

FIG. 4 illustrates the emission intensity when the red emitting layer and the blue emitting layer are included in the third emitting part 600. As shown in FIG. 4, the emission peak is shown only in the red emitting layer.

Thus, if one emitting part includes the red emitting layer and the blue emitting layer, an efficiency of the blue emitting layer is lowered, whereby a luminance of the organic light emitting display device is lowered. This will be described with reference to FIG. 5.

Figure 5:
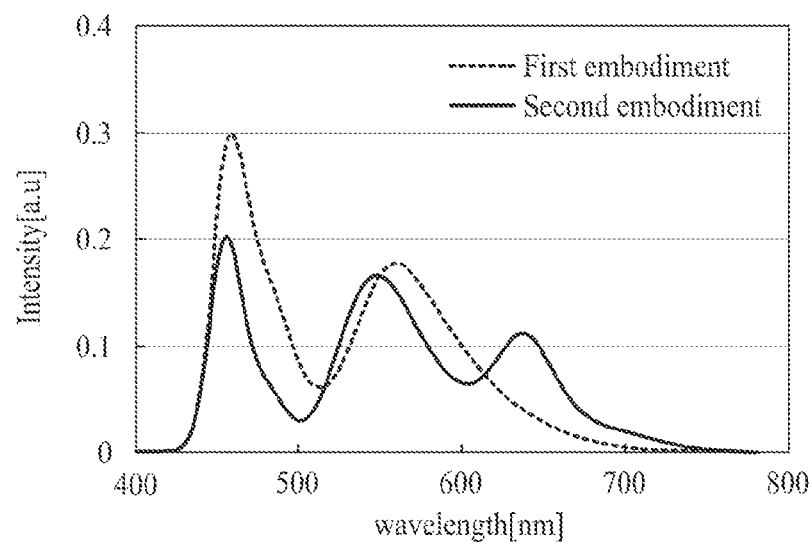
FIG. 5 illustrates an emission intensity of an organic light emitting display device according to the first embodiment of the present invention, which includes a first emitting part having a blue emitting layer, a second emitting part having a yellow-green emitting layer, and a third emitting part having a blue emitting layer, and an emission intensity of an organic light emitting display device according to the second embodiment of the present invention, which includes a first emitting part having a blue emitting layer, a second emitting part having a yellow-green emitting layer, and a third emitting part having red and blue emitting layers.

FIG. 5 illustrates an emission intensity of the organic light emitting display device according to the first and second embodiments of the present invention. In FIG. 5, a horizontal axis represents a wavelength (nm) of light, and a vertical axis represents emission intensity (a.u., arbitrary unit). Emission intensity is a numeric value expressed as a relative value based on a maximum value of EL spectrum. For example, as shown in FIG. 5, the emission intensity in the blue area having a range of 440 nm to 480 nm may be 0.30 (a.u.) and the emission intensity in the yellow-green area having a range of 510 nm to 590 nm may be 0.18 (a.u.) by conversion based on 0.30 (a.u.) which is a maximum value of the EL spectrum. That is, 0.18 (a.u.) is expressed as a relative value based on 0.30 (a.u.) which is the maximum value of the EL spectrum. Also, the emission intensity in the yellow-green area is expressed based on the emission intensity in the blue area which is the maximum value of EL spectrum. In FIG. 5, in case of the first embodiment of the present invention, the first emitting layer (EML) of the first emitting part includes the blue emitting layer, the first emitting layer (EML) of the second emitting part includes the yellow-green emitting layer, and the first emitting layer (EML) of the third emitting part includes the blue emitting layer. In case of the second embodiment of the present invention, the first emitting layer (EML) of the first emitting part includes the blue emitting layer, the second emitting layer (EML) of the second emitting part includes the yellow-green emitting layer, the third emitting layer (EML) of the third emitting part includes the red emitting layer, and the fourth emitting layer (EML) of the third emitting part includes the blue emitting layer.

As shown in FIG. 5, as compared with the first embodiment of the present invention, in case of the second embodiment of the present invention, an emission peak is shown in a range of 600 nm to 650 nm corresponding to an emission peak of the red emitting layer. That is, it is a TER-TEP (Three Emission Region-Three Emission Peak) structure in which the three emitting parts have the three emission peaks.

In the second embodiment of the present invention, an emission intensity is reduced in a range from 440 nm to 480 nm corresponding to an emission peak of the blue emitting layer, as compared with the first embodiment of the present invention.

Also, results obtained by measuring DCI (Digital Cinema Initiatives) color reproduction ratio and luminance are shown in the following Table 1.

TABLE 1

|  | DCI color reproduction ratio (%) | Luminance (%) |
| --- | --- | --- |
| First embodiment | 88% | 100% |
| Second embodiment | 97% | 86% |

As shown in the above Table 1, in case of the second embodiment of the present invention, the emission efficiency of the red emitting layer is improved so that the color reproduction ratio is improved by 9%, as compared with the first embodiment of the present invention.

In case of the second embodiment of the present invention, the emission intensity of the blue emitting layer is reduced so that the luminance of the organic light emitting display device is reduced by 14%, as compared with the first embodiment of the present invention.

Accordingly, if one emitting part includes the two emitting layers, the emission intensity of the red emitting layer is increased. However, the emission intensity of the blue emitting layer is reduced. Also, the color reproduction ratio is improved. However, the luminance is lowered due to the reduced emission intensity of the blue emitting layer. This will be described with reference to FIG. 6.

Figure 6:
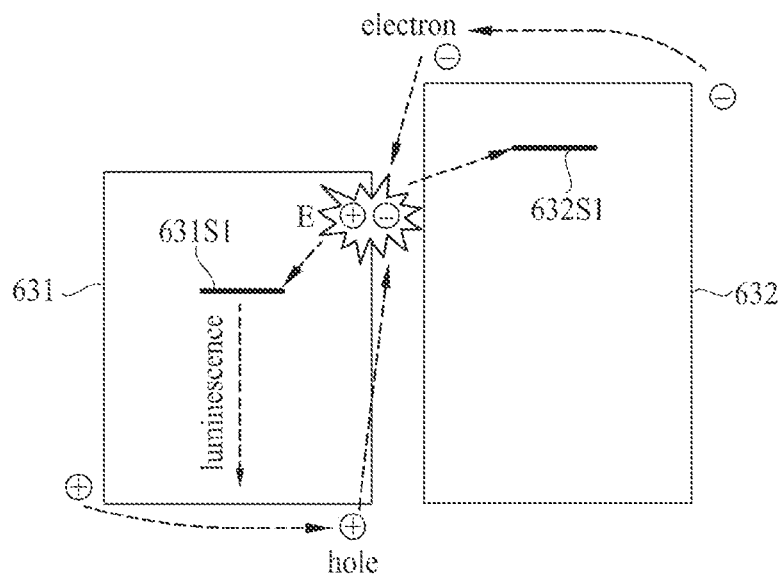
FIG. 6 illustrates an energy band diagram of an emitting part having red and blue emitting layers in an organic light emitting display device according to the second embodiment of the present invention.

FIG. 6 illustrates a band diagram of the emitting part according to the second embodiment of the present invention.

FIG. 6 illustrates the organic light emitting display device including the three emitting parts, wherein the third emitting part includes the two emitting layers. One among the two emitting layers, that is, the third emitting layer (EML) 631 includes the red emitting layer, and the other emitting layer, that is, the fourth emitting layer (EML) 632 includes the blue emitting layer.

A luminescence denotes that a material is excited by an energy caused by electromagnetic waves, heat or friction, and the excited material emits light having a certain wavelength. In case of the organic light emitting device, a luminescent material of the organic emitting layer becomes an excited state (S1) by an energy caused by a combination of an electron (See ⊖ of FIG. 6) and a hole (See ⊕ of FIG. 6), and then light is produced when the excited state of the luminescent material returns back to a ground state. In FIG. 6, a solid line denotes a transfer of the electron and hole.

If providing the two emitting layers of the red emitting layer and the blue emitting layer, only the red emitting layer is luminescent due to a difference in energy band gap between the red emitting layer and the blue emitting layer. An energy band gap of host in the red emitting layer is 2.4 eV, and an energy band gap of host in the blue emitting layer is 3.0 eV. An excited state 631S1 of the red emitting layer, that is, the singlet energy level, is lower than an energy level 632S1 of the blue emitting layer, whereby energy of the exciton (E) produced at the interface between the red emitting layer and the blue emitting layer is lowered. Accordingly, the exciton is not transferred to the blue emitting layer, but transferred to the red emitting layer of the stable state, whereby only the red emitting layer becomes luminescent.

Accordingly, it is noted by the inventors of the present invention that only the red emitting layer is luminescent when the red emitting layer and the blue emitting layer are included in one emitting part. Thus, the inventors of the present invention performed various experiments for making both the red emitting layer and the blue emitting layer luminescent when the red emitting layer and the blue emitting layer are included in one emitting part.

Based on the various experiments, it was found that controlling or adjusting the properties of the red emitting layer whose energy level is relatively lower is more efficient than controlling or adjusting the properties of the blue emitting layer having a higher singlet energy level. If the singlet energy level of the blue emitting layer is lowered, the luminescence of the blue emitting layer becomes more difficult. For the luminescence of the blue emitting layer, the singlet energy level of the blue emitting layer should not be less than 2.8 eV.

Accordingly, it is possible to provide a white organic light emitting display device with a new structure capable of improving the emission efficiency of the red emitting layer and the blue emitting layer, and realizing the improved luminance by controlling or adjusting the properties of the red emitting layer whose singlet energy level is relatively lower than that of the blue emitting layer.

In case of the white organic light emitting display device according to the embodiment of the present invention, the three emission peaks are provided in the three emitting parts of first, second and third emitting parts. At this time, the blue emission peak corresponding to the first emission peak is shown by the first emitting layer in the first emitting part, the yellow-green emission peak corresponding to the second emission peak is shown by the second emitting layer in the second emitting part, and the red emission peak corresponding to the third emission peak is shown by the red emitting layer corresponding to one among the two emitting layers in the third emitting part. Accordingly, it is possible to improve the luminance and color reproduction ratio of the organic light emitting display device by applying a TER-TEP (Three Emission Region-Three Emission Peak) structure having the three emission peaks in the three emitting parts.

In the organic light emitting display device including at least three emitting parts according to the embodiment of the present invention, one emitting part includes the red emitting layer and the blue emitting layer, and the blue emitting layer is adjacent to the second electrode. Thus, the blue emitting layer and the red emitting layer are capable of being luminescent in the emission peak of the desired emission region so that it is possible to improve the color reproduction ratio and the emission intensity of the red emitting layer and the blue emitting layer.

Both the red emitting layer and the blue emitting layer are capable of being luminescent in the emission peak of the desired emission region by controlling or adjusting the properties of the red emitting layer, whereby it is possible to improve the color reproduction ratio of the red emitting layer and the blue emitting layer, and to improve the luminance of the organic light emitting display device.

According to the various experiments for controlling or adjusting the properties of the red emitting layer, it is known that the properties of the device can be improved by applying an organic material having a hole transporting property, that is, a hole transporting layer (HTL) material to the red emitting layer. This will be described with reference to FIG. 7.

Figure 7:
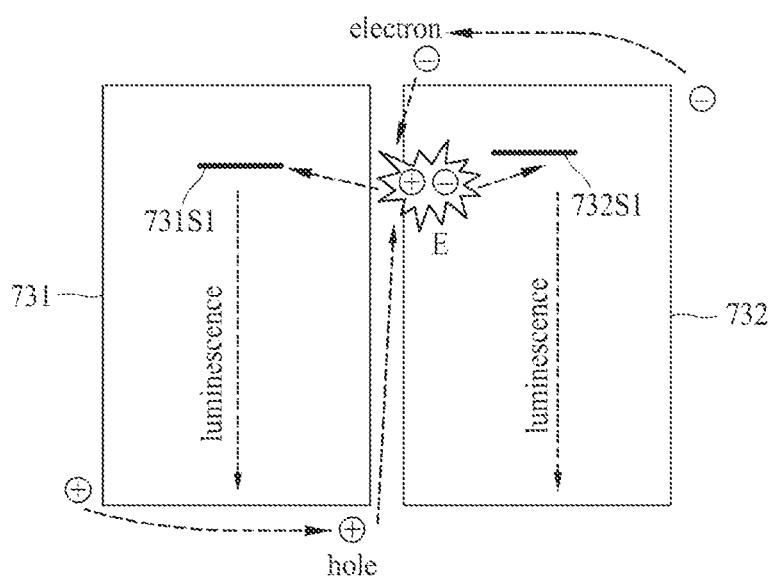
FIG. 7 illustrates an energy band diagram of an emitting part having red and blue emitting layers in an organic light emitting display device according to the third embodiment of the present invention.

FIG. 7 illustrates an energy band diagram of an emitting part according to the third embodiment of the present invention.

FIG. 7 illustrates an organic light emitting display device including three emitting parts, wherein the third emitting part includes two emitting layers, that is, red emitting layer (EML) 731 and blue emitting layer (EML) 732. At this time, an organic material having a hole transporting property, that is, a hole transporting layer (HTL) material is applied as a host of the red emitting layer.

As shown in FIG. 7, a host of the red emitting layer (EML) 731 includes the organic material having the hole transporting property, that is, the hole transporting layer (HTL) material. In the third embodiment of the present invention, an energy band gap of the hole transporting layer (HTL) material is larger than an energy band gap of the host in the red emitting layer (EML) 731, whereby there is a small difference between the energy band gap of the red emitting layer (EML) 731 and the energy band gap of the blue emitting layer (EML) 732. Thus, a singlet energy level 731S1 of the red emitting layer (EML) 731 is nearly identical to a singlet energy level 732S1 of the blue emitting layer (EML) 732. For example, the energy band gap of the hole transporting layer (HTL) material is within a range of 2.8 eV to 3.5 eV.

In comparison to the host of the red emitting layer (EML) 731, the hole transporting layer (HTL) material has a relatively large hole mobility so that it is possible to restrain the luminescence of the red emitting layer (EML) 731.

Also, the hole mobility of the hole transporting layer (HTL) material is larger than an electron mobility thereof, whereby a lot of holes are generated at the interface between the red emitting layer (EML) 731 and the blue emitting layer (EML) 732 by the hole transporting layer (HTL) material.

Accordingly, the hole transporting layer (HTL) material enables a lot of holes to be at the interface between the red emitting layer (EML) 731 and the blue emitting layer (EML) 732. Thus, a recombination zone in which an exciton is produced by a combination of electron (See ⊖ of FIG. 7) and hole (See ⊕ of FIG. 7) is shifted to the blue emitting layer (EML) 732, thereby enabling the luminescence of the blue emitting layer (EML) 732. In FIG. 7, a solid line denotes a transfer of the electron and hole.

The host of the red emitting layer (EML) 731 may include a mixed host having the hole transporting layer (HTL)

material. For example, the host of the red emitting layer (EML) 731 may be formed of a material including CBP(4,4'-bis(carbazol-9-yl)biphenyl) or mCP(1,3-bis(carbazol-9-yl)benzene), but is not limited to these materials. For example, the hole transporting layer (HTL) material may be formed of a benzidine-based material, a biphenyl-based material, an amine-based material, and etc., but is not limited to these materials. If the host of the red emitting layer (EML) 731 includes the mixed host, any one among the host material of the red emitting layer (EML) 731 and the hole transporting layer (HTL) material may be mixed, but is not limited to these materials.

Figure 8:
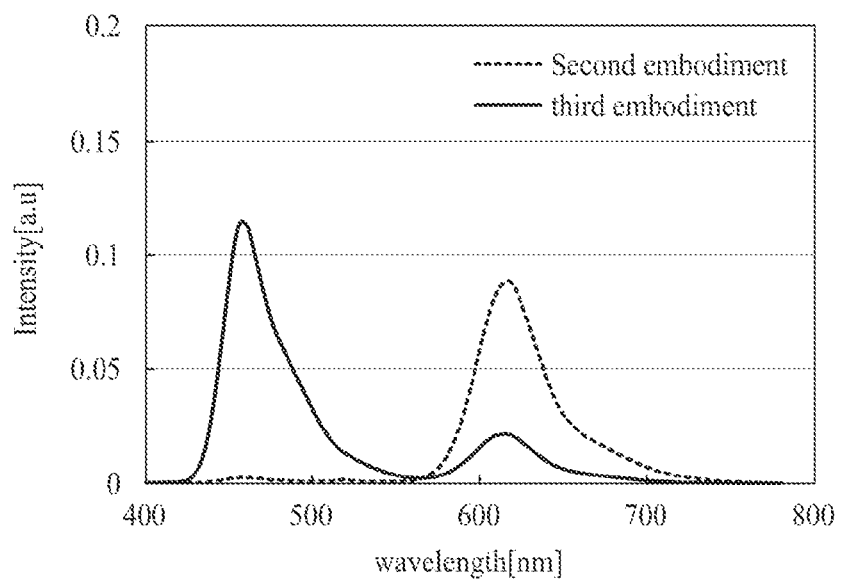
FIG. 8 illustrates an emission intensity of an emitting part according to the second and third embodiments of the present invention.

FIG. 8 illustrates the emission intensity of the emitting part according to the second embodiment of the present invention and the third embodiment of the present invention. In FIG. 8, a horizontal axis represents a wavelength (nm) of light, and a vertical axis represents emission intensity (a.u., arbitrary unit). Emission intensity is a numeric value expressed as a relative value based on a maximum value of EL spectrum. For example, as shown in FIG. 8, the emission intensity in the blue area having a range of 440 nm to 480 nm may be 0.12 (a.u.) and the emission intensity in the red area having a range of 600 nm to 650 nm may be 0.08 (a.u.) by conversion based on 0.12 (a.u.) which is a maximum value of the EL spectrum. That is, 0.08 (a.u.) is expressed as a relative value based on 0.12 (a.u.) which is the maximum value of the EL spectrum. Also, the emission intensity in the red area is expressed based on the emission intensity in the blue area which is the maximum value of EL spectrum.

In FIG. 8, in case of the second embodiment of the present invention, red host and red dopant are included in the red emitting layer, and blue host and blue dopant are included in the blue emitting layer. In case of the third embodiment of the present invention, the host of the hole transporting layer material and red dopant are included in the red emitting layer, and blue host and blue dopant are included in the blue emitting layer.

As shown in FIG. 8, in case of the second embodiment of the present invention, the emission peak of the blue emitting layer is not shown, and the emission intensity is shown in a range of 600 nm to 650 nm corresponding to the emission peak of the red emitting layer. In the third embodiment of the present invention, the emission intensity is decreased in the range of 600 nm to 650 nm corresponding to the emission peak of the red emitting layer, as compared with the second embodiment of the present invention. In the third embodiment of the present invention, the emission intensity is shown in a range of 440 nm to 480 nm corresponding to the emission peak of the blue emitting layer. As the host of the hole transporting layer material is applied to the red emitting layer according to the third embodiment of the present invention, it is possible to realize the luminescence in both the red emitting layer and the blue emitting layer, and to improve the emission efficiency of the red emitting layer and the blue emitting layer.

A result obtained by measuring driving voltage, external quantum efficiency and color coordinates according to the second and third embodiments of the present invention are shown in the following Table 2.

TABLE 2

| | Emitting part | | | | | |
|---|---|---|---|---|---|---|
| | Red emitting layer | Blue emitting layer | Volt (V) | EQE (%) | CIEx | CIEy |
| Second embodiment | Host + Dopant | Host + Dopant | 3.5 | 8.2 | 0.632 | 0.341 |

TABLE 2-continued

| | Emitting part | | | | | |
|---|---|---|---|---|---|---|
| | Red emitting layer | Blue emitting layer | Volt (V) | EQE (%) | CIEx | CIEy |
| Third embodiment | Hole transporting layer + Dopant | Host + Dopant | 3.6 | 8.2 | 0.193 | 0.137 |

As shown in the above Table 2, the driving voltage (Volt, V) is nearly identically maintained in the second embodiment and the third embodiment of the present invention. The driving voltage is maintained without change even though the host of the red emitting layer includes the hole transporting layer (HTL) material.

Also, EQE (External Quantum Efficiency) is the emission efficiency when the light goes out from the organic light emitting display device to the external environment. The external quantum efficiency (EQE) is identically maintained in the second embodiment and the third embodiment of the present invention. The external quantum efficiency (EQE) is maintained without change even though the host of the red emitting layer includes the hole transporting layer (HTL) material.

In case of the color coordinates according to the second embodiment of the present invention, CIEx is 0.632, and CIEy is 0.341. In case of the color coordinates according to the third embodiment of the present invention, CIEx is 0.193, and CIEy is 0.137. In case of the third embodiment of the present invention, it is possible to obtain the desired color coordinates, as compared with the second embodiment of the present invention.

As the hole transporting layer (HTL) material is applied to the host of the red emitting layer, it is possible to improve the emission efficiency of the red emitting layer and the blue emitting layer, and also to improve the color reproduction ratio. As the hole transporting layer (HTL) material is applied to the host of the red emitting layer, it is possible to provide a device which prevents the driving voltage from being increased, and also prevents the external quantum efficiency from being deteriorated.

Results obtained by measuring the properties of the white organic light emitting display device shown in FIG. 2 will be described with reference to the following Table 3 and FIG. 9.

Table 3 illustrates results obtained by measuring the luminance and DCI color reproduction ratio according to the first and third embodiments of the present invention.

In the following Table 3 and FIG. 9, in case of the first embodiment of the present invention, the first emitting layer (EML) of the first emitting part includes the blue emitting layer, the first emitting layer (EML) of the second emitting part includes the yellow-green emitting layer, and the first emitting layer (EML) of the third emitting part includes the blue emitting layer.

TABLE 3

| | DCI color reproduction ratio (%) | Luminance (%) |
|---|---|---|
| First embodiment | 88% | 100% |
| Third embodiment | 91% | 118% |

As shown in the above Table 3, the DCI color reproduction ratio of the first embodiment is 88%, and the DCI color reproduction ratio of the third embodiment is 91%. As the emission efficiency is improved in both the red emitting layer and the blue emitting layer according to the present invention, the DCI color reproduction ratio of the third embodiment is improved as compared with the DCI color reproduction ratio of the first embodiment.

Based on the results of luminance, the luminance of the third embodiment is improved about 18% as compared with the luminance of the first embodiment. As the red emitting layer and the blue emitting layer help the luminescence of the organic light emitting display device, the luminance of device is improved.

Figure 9:
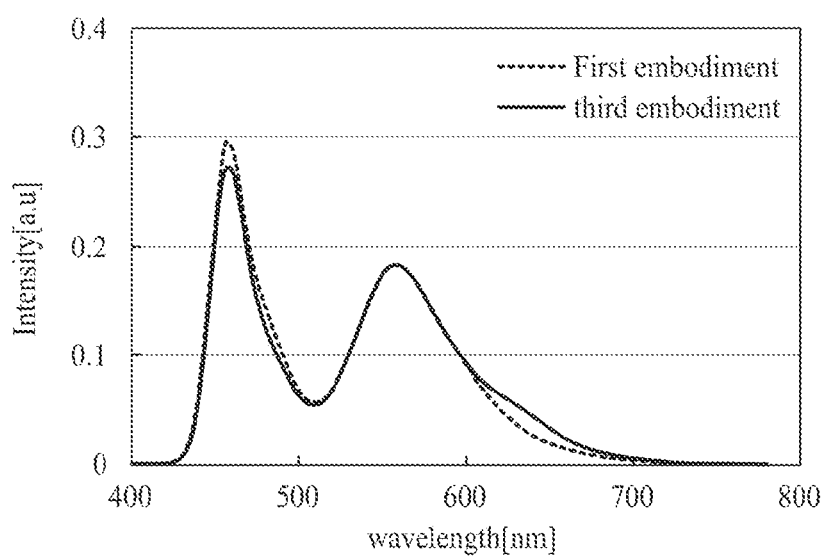
FIG. 9 illustrates an emission intensity of a white organic light emitting display device according to the first and third embodiments of the present invention.

FIG. 9 illustrates the emission intensity of the white organic light emitting display device according to the first and third embodiments of the present invention. In FIG. 9, a horizontal axis denotes the wavelength (nm) of light, and a vertical axis denotes the emission intensity (a.u., arbitrary unit). Emission intensity is a numeric value expressed as a relative value based on a maximum value of EL spectrum. For example, as shown in FIG. 9, the emission intensity in the blue area having a range of 440 nm to 480 nm may be 0.30 (a.u.) and the emission intensity in the yellow-green area having a range of 510 nm to 590 nm may be 0.18 (a.u.) by conversion based on 0.30 (a.u.) which is a maximum value of the EL spectrum. That is, 0.18 (a.u.) is expressed as a relative value based on 0.30 (a.u.) which is the maximum value of the EL spectrum. Also, the emission intensity in the yellow-green area is expressed based on the emission intensity in the blue area which is the maximum value of EL spectrum.

As shown in FIG. 9, the third embodiment of the present invention shows the TER-TEP (Three Emission Region-Three Emission Peak) structure in which the three emitting parts have the three emission peaks. In the third embodiment of the present invention, the emission peak is shown in the range of 600 nm to 650 nm corresponding to the emission peak of the red emitting layer by the red emitting layer, that is, one among the two emitting layers in the third emitting part, as compared with the first embodiment of the present invention.

As shown in FIG. 9, in comparison to the emission intensity of the first embodiment, the emission intensity of the third embodiment is slightly reduced in the range of 440 nm to 480 nm corresponding to the emission peak of the emission region of the blue emitting layer. Also, the emission intensity of the third embodiment is shown in the range of 600 nm to 650 nm corresponding to the emission peak of the emission region of the red emitting layer.

Also, the emission peak of the first and third embodiments is identically shown in the range of 520 nm to 590 nm corresponding to the emission peak of the emission region of the yellow-green emitting layer.

Accordingly, if the white organic light emitting display device includes the three emitting parts, and any one among the three emitting parts includes the red emitting layer and the blue emitting layer, it is the TER-TEP (Three Emission Region-Three Emission Peak) structure having the three emission peaks in the three emitting parts. Also, if the red emitting layer and the blue emitting layer are applied to one emitting part among the three emitting parts, both the red emitting layer and the blue emitting layer are capable of being luminescent so that the emission intensity of the red emitting layer is increased.

The properties of the organic light emitting display device according to the present invention are shown as follows.

First, according to one embodiment of the present invention, the blue emitting layer is included in each of the first emitting part 200 and the third emitting part 600, whereby the blue light with the relatively low efficiency is emitted from the two emitting parts 200 and 600, thereby improving the emission efficiency.

Second, according to another embodiment of the present invention, the third emitting part 600 includes the third emitting layer 631 of the red emitting layer and the fourth emitting layer 632 of the blue emitting layer so that it is possible to improve the emission efficiency without increasing the number of emitting parts to four.

In more detail, the blue light is emitted from the first emitting part 200, and the yellow-green or green light is emitted from the second emitting part 400. Thus, the emission efficiency of the red light may be lowered in the combination of the first emitting part 200 and the second emitting part 400. That is, it is additionally needed to provide the emitting part for emitting the red light. Especially, if the second emitting layer 430 in the second emitting part 400 emits both the light of red region and the light of green region, the emission efficiency of red light and the emission efficiency of green light are lowered. Especially, the emission intensity of the red light corresponding to the long wavelength range is lowered so that the emission efficiency of the red light is lowered more. Also, the wavelength range in which a transmittance of color filter is at the maximum does not correspond to the emission peak of the yellow-green light. Thus, in case of the white organic light emitting display device for realizing the red, green and blue light through the use of color filters, the efficiency of red and green light may be lowered, and the color purity of red and green light may be lowered.

Accordingly, it is preferable that the red emitting layer of the long wavelength be additionally provided. In this case, in addition to the third emitting part 600 including the blue emitting layer in order to improve the emission efficiency of the blue light, there may additionally be a fourth emitting part including the red emitting layer, whereby a thickness of the organic light emitting display device is increased, and a driving voltage of the organic light emitting display device is raised. According to another embodiment of the present invention, the third emitting part 600 includes the third emitting layer 631 of the red emitting layer and the fourth emitting layer 632 of the blue emitting layer so that it is possible to improve the emission efficiency of the blue light and the emission efficiency of the red light while maintaining three emitting parts. Also, since the third emitting part 600 includes the third emitting layer 631 of the red emitting layer, the color purity of the red light is improved, and the wavelength in which the transmittance of color filter is at the maximum corresponds to the emission peak of the red light.

As described above, the white organic light emitting display device according to another embodiment of the present invention is provided with the three emitting parts of the first emitting part 200, the second emitting part 400 and the third emitting part 600, that is, the white organic light emitting display device according to another embodiment of the present invention is formed in a TER-TEP (Three Emission Region-Three Emission Peak) structure in which the three emitting parts have the three emission peaks, to thereby improve the luminance and color reproduction ratio of the organic light emitting display device according to the present invention. The three emission peaks include the blue emission peak by the first emitting layer 230 in the first emitting part 200, the yellow-green emission peak by the second emitting layer 430 in the second emitting part 400, and the red emission peak by the third emitting layer 631 in the third emitting part 600.

Third, according to another embodiment of the present invention, when determining a stacking order of the third emitting layer 631 of the red emitting layer and the fourth emitting layer 632 of the blue emitting layer in the third emitting part 600, the third emitting layer 631 of the red emitting layer is distant from the second electrode 700, and the fourth emitting layer 632 of the blue emitting layer is adjacent to the second electrode 700, to thereby improve the color viewing angle in accordance with the viewing angle.

Fourth, according to another embodiment of the present invention, the third emitting layer 631 of the red emitting layer in the third emitting part 600 includes the host material having the energy band gap which does not absorb the blue light, whereby both the red light and the blue light are emitted from the third emitting part 600, as described with reference to FIGS. 4 to 7.

As known from the results of FIGS. 3 and 4 and Table 1, when the third emitting part 600 includes the third emitting layer 631 of the red emitting layer and the fourth emitting layer 632 of the blue emitting layer, the color reproduction ratio is improved, however, the emission efficiency of the blue light is not improved, and the luminance is also lowered.

The emission efficiency of the blue light is lowered because the host material of the red emitting layer absorbs the light emitted from the blue emitting layer and the red light is emitted from the red emitting layer by the absorbed light in the structure where the fourth emitting layer 632 of the blue emitting layer is brought into contact with the third emitting layer 631 of the red emitting layer, as described with reference to FIG. 6.

According to another embodiment of the present invention, the host material for the red emitting layer 631 is configured not to absorb the light emitted from the blue emitting layer 632. To this end, it is required to decrease the difference of energy band gap between the red emitting layer 631 and the blue emitting layer 632.

As shown in FIG. 7, in case of the third embodiment of the present invention, the energy band gap of the red emitting layer 631 is increased so that it is possible to prevent the exciton (E) produced at the interface between the red emitting layer 631 and the blue emitting layer 632 from being shifted to the red emitting layer 631, whereby both the red emitting layer 631 and the blue emitting layer 632 are capable of being luminescent.

Especially, according to another embodiment of the present invention, in consideration of the energy band gap of the host material in the blue emitting layer 632 corresponding to 3.0 eV, the red emitting layer 631 includes the first host material whose energy band gap is no less than 2.7 eV. That is, since the first host material whose energy band gap is no less than 2.7 eV does not absorb the light emitted from the blue emitting layer 632, the first host material is appropriate for the red emitting layer 631. When the energy band gap of the host material included in the blue emitting layer 632 is not more than a value of 0.3 eV more than the energy band gap of the host material in the red emitting layer 631, it is possible to improve both the emission efficiency of red light and the emission efficiency of blue light.

The first host material whose energy band gap is no less than 2.7 eV may include the organic material having the hole transporting property, for example, may include the same material as that of the first hole transporting layer 220, the second hole transporting layer 420 or the third hole transporting layer 620. The energy band gap of the organic material for the first hole transporting layer 220, the second hole transporting layer 420 or the third hole transporting layer 620 is within a range of 2.8 eV to 3.5 eV.

Especially, the first host material of the red emitting layer 631 includes the organic material for the first hole transporting layer 220, the second hole transporting layer 420 or the third hole transporting layer 620, that is, the organic material whose hole mobility is larger than the electron mobility, whereby the hole transporting capacity is improved, that is, the hole is easily transferred from the red emitting layer 631 to the blue emitting layer 632. Accordingly, due to the shift of the recombination zone of the hole and electron into the blue emitting layer 632, the luminescence of the red emitting layer 631 is reduced and the luminescence of the blue emitting layer 632 is improved.

Also, the first host material whose energy band gap is no less than 2.7 eV may include the host material in the blue emitting layer 632, or the host material in the green emitting layer or yellow-green emitting layer for the second emitting layer 430.

Fifth, according to another embodiment of the present invention, the host material of the red emitting layer 631 in the third emitting part 600 is appropriately selected so that it is possible to efficiently control or adjust the red luminescence and the blue luminescence in the third emitting part 600.

As described above, if the red emitting layer 631 includes the first host material whose energy band gap is no less than 2.7 eV, the red luminescence of the red emitting layer 631 may be decreased and the blue luminescence of the blue emitting layer 632 may be increased. In this case, if the red emitting layer 631 further includes the second host material whose energy band gap is less than 2.7 eV in addition to the first host material, the red luminescence is increased and the blue luminescence is reduced, as compared with the red emitting layer 631 including only the first host material. The second host material may be a red phosphorescent host material whose energy band gap is within a range of 2.2 eV to 2.4 eV. In more detail, the second host material may be formed of a phosphorescent host material such as carbazole compound such as CBP or mCP or metal complex.

Figure 10:
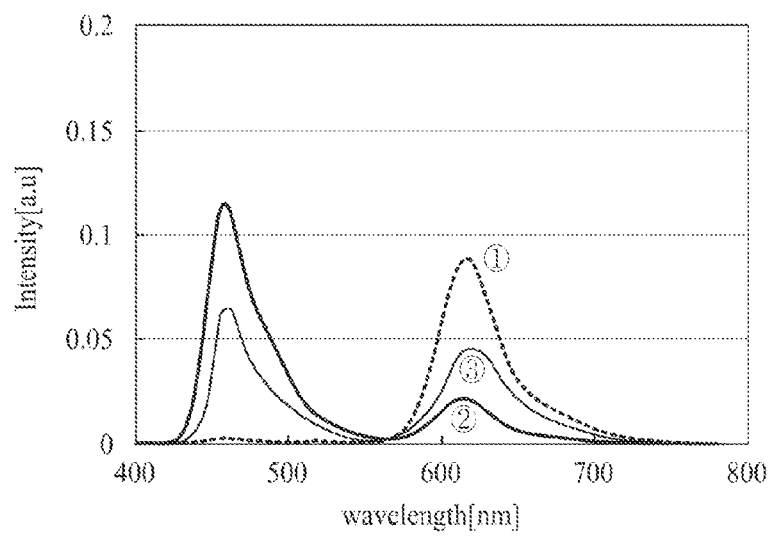
FIG. 10 illustrates an emission intensity of an emitting part having a red emitting layer and a blue emitting layer in an organic light emitting display device according to the present invention.

FIG. 10 illustrates the emission intensity of the emitting part having the red emitting layer 631 and the blue emitting layer 632. In FIG. 10, a horizontal axis denotes the wavelength (nm) of light, and a vertical axis denotes the emission intensity (a.u., arbitrary unit). Emission intensity is a numeric value expressed as a relative value based on a maximum value of EL spectrum. For example, as shown in FIG. 10, the emission intensity in the blue area having a range of 440 nm to 480 nm may be 0.12 (a.u.) and the emission intensity in the red area having a range of 600 nm to 650 nm may be 0.08 (a.u.) by conversion based on 0.12 (a.u.) which is a maximum value of the EL spectrum. That is, 0.08 (a.u.) is expressed as a relative value based on 0.12 (a.u.) which is the maximum value of the EL spectrum. Also, the emission intensity in the red area is expressed based on the emission intensity in the blue area which is the maximum value of EL spectrum.

In FIG. 10, a graph marked as ① shows a case having the red emitting layer 631 including only the red phosphorescent second host material whose energy band gap is within a range of 2.2 eV to 2.4 eV, a graph marked as ② shows a case having the red emitting layer 631 including the first host material whose energy band gap is no less than 2.7 eV and also has the hole transporting property, and a graph marked as ③ shows a case having the red emitting layer 631 including both the red phosphorescent second host material whose energy band gap is within a range of 2.2 eV to 2.4 eV and the first host material whose energy band gap is no less than 2.7 eV and also has the hole transporting property.

As shown in FIG. 10, in case of the graph marked as ③, an emission intensity of a blue wavelength band is increased and an emission intensity of a red wavelength band is reduced, as compared with the case of the graph marked as ①. That is, while a peak wavelength of the blue emitting layer is not shown in case of ①, a peak wavelength of the blue emitting layer is shown in a range of 440 nm to 480 nm in case of ③. Also, a red peak wavelength is shown in a range of 600 nm to 650 nm in case of ① and ③, wherein an emission intensity of the red peak wavelength in case of ③ is relatively reduced as compared with an emission intensity of the red peak wavelength in case of ①.

Also, in case of the graph marked as ③, an emission intensity of a blue wavelength band is reduced and an emission intensity of a red wavelength band is increased, as compared with the case of the graph marked as ②.

In the structure of the red emitting layer 631, if adjusting a content ratio of the red phosphorescent second host material whose energy band gap is within a range of 2.2 eV to 2.4 eV to the first host material whose energy band gap is no less than 2.7 eV and also has the hole transporting property, it is possible to adjust the emission intensity of red light and the emission intensity of blue light. Especially, for the red luminescence and the blue luminescence, a weight ratio of the first host material to the second host material is 7~8:2~3. That is, 70~80 weight % of the first host material is included in the total host material of the red emitting layer 631, and 20~30 weight % of the second host material is included in the total host material of the red emitting layer 631, preferably.

Figure 11:
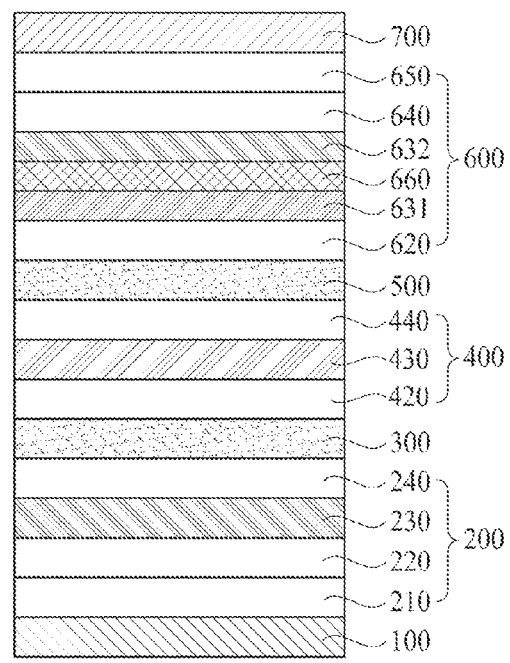
FIG. 11 is a cross sectional view illustrating an organic light emitting display device according to another embodiment of the present invention.

FIG. 11 is a cross sectional view illustrating an organic light emitting display device according to another embodiment of the present invention. Except an additionally-provided emission adjusting part 660 of a third emitting part 600, the organic light emitting display device of FIG. 11 is identical in structure to the organic light emitting display device of FIG. 2, whereby the same reference numbers will be used throughout the drawings to refer to the same or like parts, and only different structure will be described in detail as follows.

As shown in FIG. 11, in the organic light emitting display device according to another embodiment of the present invention, an emission adjusting part 660 is further included between a third emitting layer 631 of a red emitting layer and a fourth emitting layer 632 of a blue emitting layer.

The emission adjusting part 660 adjusts red luminescence of the third emitting layer 631 and blue luminescence of the fourth emitting layer 632. The emission adjusting part 600 enables the red luminescence and blue luminescence. The emission adjusting part 660 may include an organic material having a hole transporting property. Especially, in the same manner as the aforementioned first host material, the emission adjusting part 660 may include a material whose energy band gap is no less than 2.7 eV and has a hole transporting property.

For the above description of the present invention, a bottom emission mode is applied to the organic light emitting display device according to the present invention, but not necessarily. That is, a top emission mode or a dual emission mode may be applied to the organic light emitting display device according to the present invention.

For the above description of the present invention, the organic light emitting display device has the three emitting parts, but not limited to this structure. The present invention may be capable of being applied to an organic light emitting display device which includes at least two emitting parts, wherein at least any one among the least two emitting parts includes two emitting layers, and any one among the two emitting layers includes a host material whose energy band gap is no less than 2.7 eV and has a hole transporting property.

Also, the organic light emitting display device according to the present invention may be applied to a lighting device, a thin light source of liquid crystal display device or a display device. Hereinafter, a display device with the organic light emitting display device according to the present invention will be described in detail as follows.

Figure 12:
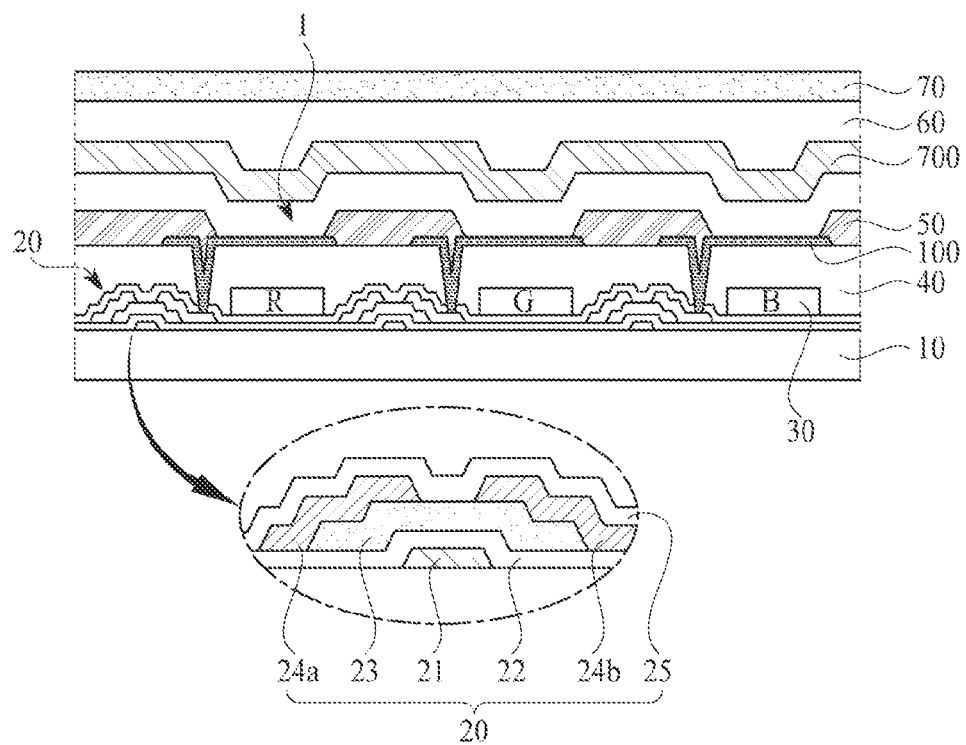
FIG. 12 is a cross sectional view illustrating an organic light emitting display apparatus according to one embodiment of the present invention.

FIG. 12 is a cross sectional view illustrating an organic light emitting display apparatus according to one embodiment of the present invention, which uses the aforementioned organic light emitting display device according to the various embodiments of the present invention.

As shown in FIG. 12, the organic light emitting display apparatus according to one embodiment of the present invention may include a substrate 10, a thin film transistor layer 20, a color filter layer 30, a planarization layer 40, a bank layer 50, a first electrode 100, an organic layer 1, a second electrode 700, an encapsulation layer 60, and an encapsulation substrate 70.

The substrate 10 may be formed of glass or flexible transparent plastic, for example, polyimide, but not limited to these materials.

The thin film transistor layer 20 is provided on the substrate 10. The thin film transistor layer 20 may include a gate electrode 21, a gate insulating film 22, a semiconductor layer 23, a source electrode 24a, a drain electrode 24b, and a passivation film 25.

The gate electrode 21 is patterned on the substrate 10, the gate insulating film 22 is provided on the gate electrode 21, the semiconductor layer 23 is patterned on the gate insulating film 22, the source electrode 24a and the drain electrode 24b facing each other are patterned on the semiconductor layer 23, and the passivation film 25 is provided on the source electrode 24a and the drain electrode 24b.

In the drawings, a bottom gate structure in which the gate electrode 21 is positioned below the semiconductor layer 23 is applied to the organic light emitting display device according to the present invention, but not necessarily. A top gate structure in which the gate electrode 21 is positioned above the semiconductor layer 23 may be applied to the organic light emitting display device according to the present invention.

The color filter layer 30 is provided on the thin film transistor layer 20. The color filter layer 30 may include red (R), green (G) and blue (B) color filters patterned by each pixel. The color filter layer 30 transmits only light with a predetermined wavelength in a white light emitted from the organic layer 1.

The planarization layer 40 is provided on the color filter layer 30, to thereby planarize a surface of the substrate 10. The planarization layer 40 may be formed of an organic insulating film such as photoacryl, but is not limited to this material.

The bank layer 50 is provided on the planarization layer 40, to thereby define a pixel region. That is, the bank layer 50 is provided in the boundaries of the plurality of pixels, and thus formed in a matrix configuration. Accordingly, the pixel region is defined by the bank layer 50.

A combination of the first electrode 100, the organic layer 1 and the second electrode 700 may be formed by the organic light emitting display device for emitting the white light in accordance with various embodiments as above.

The first electrode 100 may be connected with the drain electrode 24b via a contact hole formed in the passivation film 25 and the planarization layer 40. The first electrode 100 may be patterned by each pixel.

The organic layer 1 may include the aforementioned first emitting part 200, first charge generating layer 300, second emitting part 400, second charge generating layer 500 and third emitting part 600. A detailed description for the structure of the organic layer 1 will be omitted.

As described above, the organic layer 1 of the respective pixels may be connected with each other without being separated from each other. According to one embodiment of the present invention, the white light is emitted from the organic layer 1, and the emitted white light passes through the color filter layer 30 patterned by each pixel, to thereby realize a full-color image. Thus, the organic layer 1 for emitting the white light is applied to the plurality of pixels in common, whereby it is possible to form the organic layer 1 without separation by each pixel.

The second electrode 700 is provided on the organic layer 1. According as a common voltage is applied to the second electrode 700, it is not required for patterning the second electrode 700 by each pixel.

The encapsulation layer 60 is provided on the second electrode 700. The encapsulation layer 60 prevents moisture from being permeated into the inside of the organic layer 1. The encapsulation layer 60 may be formed of a plurality of layers having different kinds of inorganic materials, or by alternately stacking an organic material and an inorganic material.

The encapsulation substrate 70 is provided on the encapsulation layer 60. The encapsulation substrate 70 may be formed of glass or plastic, or may be formed of metal. The encapsulation substrate 70 may be attached to the encapsulation layer 60 by the use of adhesive.

The organic light emitting display apparatus shown in FIG. 12 is manufactured in a bottom emission mode in which the light emitted from the organic layer 1 advances toward the substrate 10 positioned therebelow, but is not limited to this structure. This organic light emitting display device may be formed in a top emission mode in which the light emitted from the organic layer 1 advances toward the encapsulation substrate 70 positioned thereabove. If the organic light emitting display device according to the present invention is formed in the top emission mode, the color filter layer 30 may be provided on a lower surface of the encapsulation substrate 70.

According to one embodiment of the present invention, the blue emitting layer is in the two emitting parts, whereby the emission efficiency of the blue light is improved.

According to one embodiment of the present invention, the red emitting layer and the blue emitting layer are in one emitting part so that it is possible to improve the emission efficiency without increasing the emitting part.

According to one embodiment of the present invention, the red emitting layer and the blue emitting layer are in one emitting part, wherein the red emitting layer included in one emitting part is apart from the cathode, and the blue emitting layer included in one emitting part is adjacent to the cathode, thereby reducing the color shift rate in accordance with the viewing angle.

According to one embodiment of the present invention, the red emitting layer and the blue emitting layer are in one emitting part, wherein the red emitting layer includes the first host material having the energy band gap which does not absorb the blue light, whereby the red light and the blue light are capable of being luminescent in one emitting part.

Also, the red emitting layer further includes the second host material which is different from the first host material so that it is possible to adjust the emission intensity of the red light and the blue light.

According to the present invention, the two emitting layers of the red emitting layer and the blue emitting layer are in one emitting part, the blue emitting layer is adjacent to the second electrode, whereby it is possible to improve the emission intensity and emission efficiency of the red emitting layer and the blue emitting layer.

Also, the two emitting layers of the red emitting layer and the blue emitting layer are in one emitting part, and a host of the red emitting layer includes a material having the hole transporting property, whereby it is possible to improve the emission efficiency of the red emitting layer and the blue emitting layer.

Also, both the red emitting layer and the blue emitting layer in one emitting part help the luminescence of the organic light emitting display device so that it is possible to improve the luminance and color reproduction ratio of the organic light emitting display device.

Also, while the two emitting layers are in one emitting part, it is possible to provide the organic light emitting display device which is capable of preventing the increase of driving voltage and the decrease of quantum efficiency.

Also, it is possible to improve the luminance and color reproduction ratio in the organic light emitting display device by applying the TER-TEP (Three Emission Region-Three Emission Peak) structure having three emitting parts and three emission peaks.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting display device comprising:
    first and second electrodes; and
    a first emitting part between the first and second electrodes, the first emitting part including a red emitting layer and a blue emitting layer adjacent to the red emitting layer, wherein the red emitting layer includes a first host material which does not absorb a blue light emitted from the blue emitting layer.

2. The white organic light emitting display device according to claim 1, wherein an energy band gap of the first host material is no less than 2.7 eV.

3. The white organic light emitting display device according to claim 1, wherein the first host material includes an organic material having a hole transporting property.

4. The white organic light emitting display device according to claim 3, wherein an energy band gap of the organic material having the hole transporting property is within a range of 2.8 eV to 3.5 eV.

5. The white organic light emitting display device according to claim 1, wherein the first host material includes a host material of the blue emitting layer.

6. The white organic light emitting display device according to claim 1, wherein an energy band gap of a host material of the blue emitting layer is no more than a value of 0.3 eV more than an energy band gap of the first host material.

7. The white organic light emitting display device according to claim 1, wherein the red emitting layer further includes a second host material, an energy band gap of the second host material being different from that of the first host material.

8. The white organic light emitting display device according to claim 7, wherein the energy band gap of the second host material is within a range of 2.2 eV to 2.4 eV.

9. The white organic light emitting display device according to claim 7, wherein a weight ratio of the first host material to the second host material is 7~8:2~3.

10. The white organic light emitting display device according to claim 1, wherein the first electrode is an anode, the second electrode is a cathode, and the blue emitting layer is more adjacent to the second electrode in comparison to the red emitting layer.

11. The white organic light emitting display device according to claim 1, further comprising an emission adjusting part between the red emitting layer and the blue emitting layer, the emission adjusting part including an organic material having hole transporting property.

12. The white organic light emitting display device according to claim 1, further comprising a second emitting part having a first peak wavelength between the first electrode and the first emitting part and a third emitting part having a second peak wavelength on the second emitting part, wherein the first emitting part, the second emitting part and the third emitting part include a TER-TEP (Three Emission Region-Three Emission Peak) structure.

13. The white organic light emitting display device according to claim 12,
wherein the first peak wavelength is within a range of 440 nm to 480 nm, the second peak wavelength is within a range of 520 nm to 590 nm, and peak wavelengths of the red emitting layer and the blue emitting layer are within a range of 600 nm to 650 nm and 440 nm to 480 nm.

14. The white organic light emitting display device according to claim 13, wherein the second emitting part having the first peak wavelength is closest to the first electrode, and the first emitting part having the red emitting layer and the blue emitting layer is closest to the second electrode.

15. A white organic light emitting display device comprising:
first and second electrodes;
a first emitting part between the first and second electrodes;
a second emitting part on the first emitting part; and
a third emitting part on the second emitting part,
wherein at least one among the first, second and third emitting parts includes two emitting layers having a red emitting layer and a blue emitting layer, and the red emitting layer includes at least two host materials that have different energy band gaps so as to improve emission efficiency of the red emitting layer and the blue emitting layer.

16. The white organic light emitting display device according to claim 15, wherein an energy band gap of a host material of the blue emitting layer is no more than a value of 0.30 eV more than the energy band gap of any one host material in the red emitting layer.

17. The white organic light emitting display device according to claim 15, wherein any one host material in the red emitting layer includes an organic material having a hole transporting property.

18. The white organic light emitting display device according to claim 15, wherein the red emitting layer and the blue emitting layer are adjacent to each other.

19. The white organic light emitting display device according to claim 15, wherein the first electrode is an anode, the second electrode is a cathode, and the blue emitting layer is closer to the second electrode than the red emitting layer.

20. The white organic light emitting display device according to claim 15, wherein the third emitting part includes the red emitting layer and the blue emitting layer, and the blue emitting layer is closer to the second electrode than the red emitting layer.

21. The white organic light emitting display device according to claim 20,
wherein a wavelength of the first emitting part is within a range of 440 nm to 480 nm, a wavelength of the second emitting part is within a range of 520 nm to 590 nm, and a wavelength of the third emitting part is within a range of 600 nm to 650 nm and 440 nm to 480 nm.

22. The white organic light emitting display device according to claim 15, further comprising:
a first charge generation layer between the first emitting part and the second emitting part; and
a second charge generation layer between the second emitting part and the third emitting part.

23. An organic light emitting display apparatus comprising:
a white organic light emitting display device for emitting a white light, the white organic light emitting display device on a substrate;
an encapsulation layer on the white organic light emitting display device; and
a color filter layer for transmitting light with a predetermined wavelength in the white light emitted from the white organic light emitting display device,
wherein the white organic light emitting display device includes:
first and second electrodes; and
an emitting part between the first and second electrodes, the emitting part including a red emitting layer and a blue emitting layer adjacent to the red emitting layer,
wherein the red emitting layer includes a first host material which does not absorb a blue light emitted from the blue emitting layer.

24. The white organic light emitting display device according to claim 23, wherein the first host material includes an organic material having a hole transporting property.

25. The white organic light emitting display device according to claim 23, wherein an energy band gap of the first host material is no less than 2.7 eV.

26. The white organic light emitting display device according to claim 23, wherein the red emitting layer further includes a second host material, and an energy band gap of the second host material is within a range of 2.2 eV to 2.4 eV.

27. The white organic light emitting display device according to claim 26, wherein a weight ratio of the first host material to the second host material is 7~8:2~3.

* * * * *